(12) United States Patent
Suda

(10) Patent No.: US 7,960,996 B2
(45) Date of Patent: Jun. 14, 2011

(54) VARIABLE DELAY CIRCUIT, TIMING GENERATOR AND SEMICONDUCTOR TESTING APPARATUS

(75) Inventor: Masakatsu Suda, Tokyo (JP)

(73) Assignee: Advantest Corp., Tokyo (JP)

( * ) Notice: Subject to any disclaimer, the term of this patent is extended or adjusted under 35 U.S.C. 154(b) by 63 days.

(21) Appl. No.: 12/310,335

(22) PCT Filed: Aug. 15, 2007

(86) PCT No.: PCT/JP2007/065917
§ 371 (c)(1),
(2), (4) Date: Feb. 19, 2009

(87) PCT Pub. No.: WO2008/023624
PCT Pub. Date: Feb. 28, 2008

(65) Prior Publication Data
US 2010/0019795 A1      Jan. 28, 2010

(30) Foreign Application Priority Data
Aug. 24, 2006   (JP) ................. 2006-227800

(51) Int. Cl.
*G01R 31/26* (2006.01)

(52) U.S. Cl. ................................. 324/762.01

(58) Field of Classification Search ................ None
See application file for complete search history.

(56) References Cited

U.S. PATENT DOCUMENTS

| | | | | |
|---|---|---|---|---|
| 5,463,343 A * | 10/1995 | Marbot | ........................ | 327/270 |
| 5,708,381 A * | 1/1998 | Higashisaka | ................. | 327/276 |
| 6,657,473 B1 * | 12/2003 | Eto | ................................ | 327/261 |
| 6,724,268 B2 * | 4/2004 | Takahashi | ...................... | 327/278 |
| 7,511,547 B2 * | 3/2009 | Suda et al. | ..................... | 327/276 |
| 2004/0251401 A1 * | 12/2004 | Watanabe | ................ | 250/214 R |
| 2005/0273684 A1 * | 12/2005 | Ochi | ............................ | 714/735 |
| 2006/0267656 A1 * | 11/2006 | Suda et al. | ..................... | 327/261 |
| 2008/0036512 A1 * | 2/2008 | Yamamoto et al. | ........... | 327/155 |
| 2010/0060294 A1 * | 3/2010 | Suda | .............................. | 324/555 |

FOREIGN PATENT DOCUMENTS

| JP | 04-294631 | 10/1992 |
|---|---|---|
| JP | 2001-292053 | 10/2001 |
| WO | WO 2005/060098 | 6/2005 |

* cited by examiner

*Primary Examiner* — Jermele M Hollington
(74) *Attorney, Agent, or Firm* — Muramatsu & Associates

(57) ABSTRACT

A variable delay circuit is designed to provided a wider range of delay time to a timing signal. The variable delay circuit includes a variable delay 50 which comprises a DA converter 51 which supplies current 51 based on delay setting data; a delay element 53 which imparts a delay amount Tpd to a prescribed signal and outputs the signal; and a bias circuit 52 which is connected such that the amount of current flown in the DA converter 51 and the amount of current flown in the delay element 53 become equal. The DA converter 51 allows the relationship between the delay setting data DATA and the current Id to be hyperbolic (inversely proportional). As a result, the relationship between the delay setting data DATA and the delay amount Tpd can be linearized, whereby the delay amount obtained by a single stage of the delay element can be increased.

5 Claims, 10 Drawing Sheets

US 7,960,996 B2

VARIABLE DELAY CIRCUIT, TIMING GENERATOR AND SEMICONDUCTOR TESTING APPARATUS

TECHNICAL FIELD

The present invention relates to a variable delay circuit which imparts a prescribed delay amount to a prescribed signal and outputs the signal, a timing generator which is provided with this variable delay circuit and a semiconductor testing apparatus provided with the variable delay circuit. In particular, the present invention relates to a variable delay circuit, a timing generator and a semiconductor testing apparatus which can increase the delay amount obtainable from a single stage of a delay element while keeping linearity by compensating the relationship between the delay time and the delay setting time to have a linear relationship.

BACKGROUND ART

Conventionally, a testing apparatus which tests an electronic device (DUT: Device under Test) such as a semiconductor device supplies a signal to an electronic device with a prescribed timing. For example, a testing apparatus is provided with a timing generator which generates a timing signal for regulating the timing.

The configuration of this timing generator is shown in FIG. 6. As shown in FIG. 6, a timing generator 100 has a counter 110, a timing memory 120, an exclusive OR circuit 130, an AND circuit 140, a linearizing memory 150 and a variable delay circuit 160 as disclosed by, for example, International publication No, WO 2005/060098.

The counter 110, the exclusive OR circuit 130 and the AND circuit 140 generate a delay which is the integral multiple of the period of a given reference clock RefClk. That is, the counter 110 receives the reference clock RefClk, and outputs a counted value which is obtained by counting the pulse number of this reference clock.

The timing memory 120 receives a timing set signal TS which indicates the timing with which a timing signal is generated by the timing generator 100, and outputs to the exclusive OR circuit 130 a control signal corresponding to the higher-order bit of the timing set signal TS.

For example, the timing set TS signal is data which shows the delay amount which is required to delay the reference clock RefClk. The timing memory 120 outputs to the exclusive OR circuit 130 a quotient obtained by dividing the delay amount by the period of the reference clock RefClk.

The timing memory 120 outputs to the linearizing memory 150 a control signal which corresponds to the lower-order bit of the timing set signal.

For example, the timing memory 120 supplies to the linearizing memory 150 a delay setting data which corresponds to the remainder of a value obtained by dividing the delay amount shown by the timing signal by the period of the reference clock.

The exclusive OR circuit 130 outputs an H-logic signal when the counted value provided by the counter 110 is in agreement with the value provided by the timing memory 120 (the value of a control signal corresponding to the higher-order bit) Then, the AND circuit 140 outputs a logical product of a signal obtained by the exclusive OR circuit 130 and a reference clock.

The linearizing memory 150 stores control data which corresponds to the linearization of the delay setting data in a fine variable delay circuit 160, and outputs a delay amount signal based on the delay setting data (the control signal corresponding to the lower-order bit) to control the delay amount in the variable delay circuit 160.

The variable delay circuit 160 delays the signal outputted by the AND circuit 140 based on the delay amount signal outputted by the linearizing memory 150, and outputs the delayed signal as a timing signal.

As shown in FIG. 7, this variable delay circuit 160 has buffers 161-1 to 161-$n$ (hereinafter simply referred to as a "buffer 161"), a multiplexer 162 and a fine delay part 170.

The plurality of buffers 161 are connected in series, and sequentially delays a signal outputted by the AND circuit 140.

The multiplexer 162 selects a signal outputted by any of the buffers 161 based on the control data (delay amount signal) provided by the linearizing memory 150 and outputs the selected data to the fine delay part 170. As a result, a delay which is the integral multiple of the delay amount in the buffer 161 is generated.

The fine delay part 170 generates a delay of which the delay step is smaller than that of the delay in the buffer 161 and of which the maximum delay is almost equal to the delay of one stage of the buffer 161. That is, this fine delay part 170 generates current Id which is proportional to a delay setting data DATA (delay amount signal) provided by the linearizing memory 150, and controls the delay amount by selecting the source current Id of a buffer 174 (mentioned later) according to this current Id.

As shown in FIG. 8, the fine delay part 170 has a DAC (Linear DA converter) 171, a BIAS (bias circuit) 172 and a delay element 173. The delay element 173 has the buffer 174 noted above and current sources 175 and 176.

The DAC 171 is capable of generating current which is larger than by k to $(k+2^n-1)$ times current Id which corresponds to a BIAS voltage applied to the current sources 175 and 176.

This DAC 171 may have a configuration shown in FIG. 9.

Specifically, in the DAC 171, switches S and current sources are paired, and a plurality of delay time converting current generating circuits 180-1 to 180-$n$ (hereinafter abbreviated as "delay time converting current generating circuit 180") are connected in parallel with respect to a terminal which provides a bias voltage (bias resolution). To these plurality of delay time converting current generating circuits 180, predetermined number of the current sources are connected in a manner indicated by a binary-coded number (*k, *1,*2, ..., *2$^{n-1}$), thereby amplifying the basic current at different magnifications.

The delay time setting switch S is turned ON and OFF based on the delay setting data. Each current is amplified at each power source, and the current corresponding to the delay setting data is selected and the selected current is supplied to a voltage converting circuit 190.

The BIAS 172 is current-mirror connected such that current Id flowing in the buffer 174 (current source transistor in the delay element) becomes equal to the current Id of the DAC 171. As a result, the current Id generated by the DAC 171 can be mirrored to the delay element 173 by current-mirror connection.

The buffer 174 delays a signal outputted by the AND circuit 140 ("IN" in FIG. 9), and outputs the delayed signal as a timing signal ("OUT" in FIG. 9). The current sources 175 and 176 regulate the source current of the buffer 174.

As shown in FIG. 10(a), the fine delay part 170 has a configuration in which the delay setting data DATA and the current Id are in a proportional relationship.

The relationship between the current Id supplied by the current sources 175 and 176 of the delay element 173 and the propagation delay time Tpd of the delay element 173 is hyperbolic (inverse proportional), as shown in FIG. 10(*b*).

As a result, the relationship between the delay setting data DATA and the propagation delay time Tpd becomes hyperbolic, as shown in FIG. (c).

Patent Document 1: WO2005/060098

DISCLOSURE OF THE INVENTION

Problems to be Solved by the Invention

However, since conventional fine delay parts (variable delay circuits) have to be used within a range in which the variable amount is substantially linear with respect to the delay setting amount data DATA (a range in which an error can be neglected; between A and B in FIG. 10 (*c*)), the delay amount obtainable from a single stage of a delay element is small. Therefore, the delay amount which is to be imparted to a timing signal is not large enough.

In addition, since the delay amount obtained by a single stage of a delay element is small, the number of delay elements required has to be increased in order to increase the overall delay amount, leading to an increase in the circuit scale.

Furthermore, due to the increased number of delay elements, power consumption was increased.

The present invention has been made in view of the above-mentioned problems, and the object thereof is to provide a variable delay circuit, a timing generator and a semiconductor testing apparatus capable of increasing the delay amount obtainable from a single stage of a delay element relative to the delay setting data, improving the accuracy of a delay amount to be imparted to a timing signal, suppressing an increase in the circuit scale, and decreasing the power consumption.

Means for Solving the Problem

In order to attain the object, the variable delay circuit of the present invention comprises a DA converter which supplies a prescribed amount of current based on delay setting data; a delay element which imparts to a prescribed signal a delay amount based on the amount of current; and a bias circuit which is connected such that the amount of current flowing in the delay element and the amount of current flowing in the DA converter become equal, wherein the DA converter supplies current which has a hyperbolic relationship with the delay setting data.

Due to such a configuration of the variable delay circuit, the relationship between the delay setting data and the current can be hyperbolic (inversely proportional) in the DAC. Since the relationship between the current and the delay time is hyperbolic, the relationship between the delay time and the delay setting data becomes linear by compensating the two hyperbolic relationships with one another. As a result, the delay amount obtained by a single stage of the delay element can be increased, thereby improving the accuracy of the delay amount to be imparted to a timing signal. Since the delay amount obtained by a single stage of the delay element is increased, an increase in the circuit scale can be suppressed, and power consumption can be reduced.

The variable delay circuit of the present invention may have a configuration in which the DA converter is provided with a transistor to which a bias voltage corresponding to a variable range of the delay element is applied and a shunt circuit which divides current which is flown from the transistor in the integral fractions.

Due to such a configuration of the variable delay circuit, the relationship between the delay setting data and the current can be hyperbolic (inverse proportional).

The variable delay circuit of the present invention may have a configuration in which, in the shunt circuit, pairs of a switch and current source are connected in multiple stages, and, for each stage, the current source is connected to N-channel transistors in a quantity which increases in a binary manner.

Due to such a configuration, the basic current can be divided in the integral fractions (1/1/1/2/1/3, . . . ) because of the binary arrangement in the shunt circuit. Further, the relationship between the delay setting data and the current can be hyperbolic because of an input/output characteristic of the transistor incorporated in the DA converter noted above.

Furthermore, the variable delay circuit of the present invention may have a configuration in which a bias voltage generating DA converter which generates a bias voltage is provided.

Due to such a configuration of the variable delay circuit, a bias voltage can be supplied by the bias voltage generating DA converter.

The timing generator of the present invention may have a configuration in which the timing generator is provided with a counter which counts and outputs the pulse number of a reference clock; a timing memory which receives a timing set signal indicating an output timing of a timing signal and outputs a control signal corresponding to the higher-order bit of the timing set signal and a control signal corresponding to the lower-order bit of the timing set signal; an exclusive OR circuit which outputs an H-logic signal when a counted value provided by the counter is in coincidence with the control signal corresponding to the higher-bit of a timing signal provided by the timing memory; an AND circuit which outputs a logical product of the signal provided by the exclusive OR circuit and the reference clock; a linearizing memory which outputs a delay amount signal based on the lower-bit control signal from the timing memory; and a variable delay circuit which delays a signal outputted by the AND circuit based on the delay amount signal and outputs externally as a timing signal. The variable delay circuit is configured in the manner descibed in the foregoing.

Due to such a configuration of the timing generator, the delay amount obtained by one stage of the delay element in the fine delay part of the variable delay circuit can be significantly increased as compared with that of the conventional timing generators. As a result, the accuracy of a delay amount to be imparted to a timing signal can be improved, the scale of the circuit can be reduced, and the power consumption can be decreased.

The semiconductor testing apparatus of the present invention may have a configuration in which the semiconductor testing apparatus is provided with a pattern generator which outputs a test pattern signal; a timing generator which outputs a timing signal; a waveform formatter which formats the test pattern signal and sends the formatted test pattern signal to a device to be tested according to a timing of the timing signal; and a judging part which judges the properties of the device based on the output signal which is outputted by the device to be tested according to the testing signal and the test pattern signal from the pattern generator. The timing generator is configured in the manner described in the foregoing.

Due to such a configuration of the semiconductor testing apparatus, it is possible to obtain from the timing generator a timing signal which has a highly accurate delay amount.

Advantageous Effects of the Invention

As mentioned hereinabove, according to the present invention, due to the hyperbolic relationship (inversely proportional relationship) between the delay setting data and the current in the DAC of the variable delay circuit, the relationship between the delay setting data and the delay amount becomes linear, because the hyperbolic relationship of the delay element is compensated, whereby the delay amount obtained by a single stage of the delay element can be widened. As a result, an increase in the circuit scale can be suppressed and power consumption can be reduced.

BEST MODE FOR CARRYING OUT THE INVENTION

Figure 1:
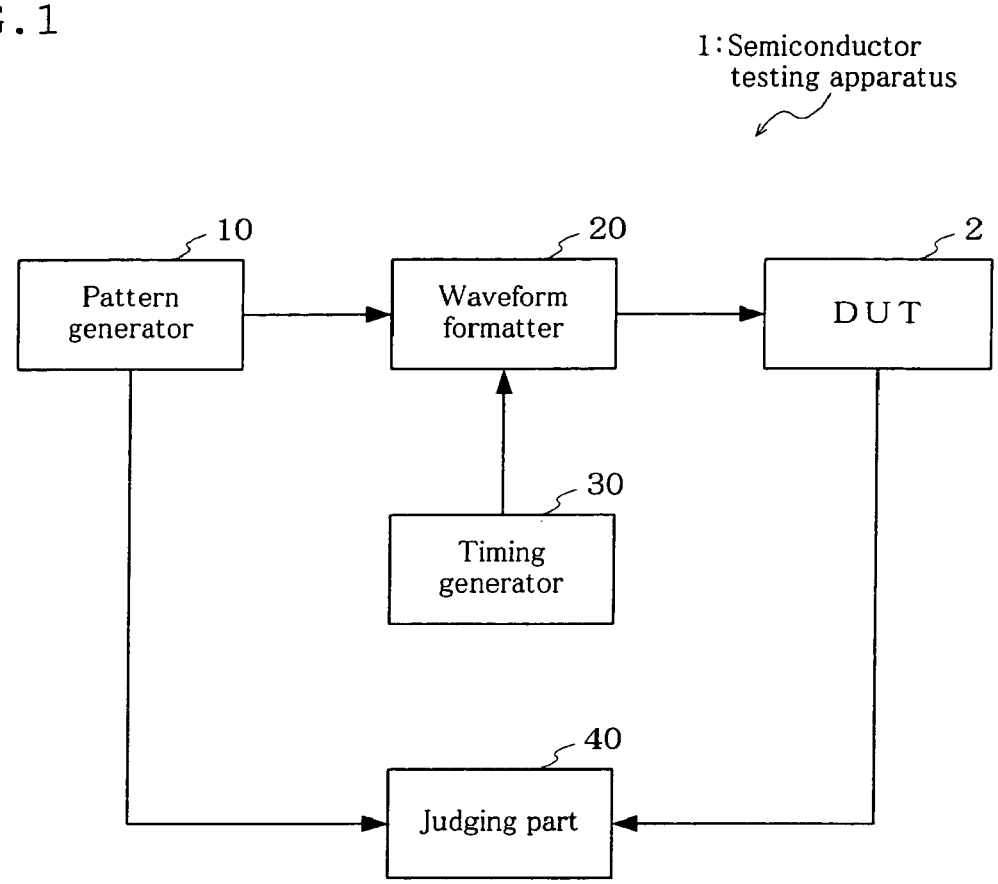
FIG. 1 is a block diagram showing a configuration of the semiconductor testing apparatus of the present invention.

A preferred embodiment of the variable delay circuit, the timing generator and the semiconductor testing apparatus of the present invention will be described below by referring to the drawings.

The embodiment of the variable delay circuit, the timing generator and the semiconductor testing apparatus of the present invention will be explained with reference to FIGS. 1 and 2.

Figure 2:
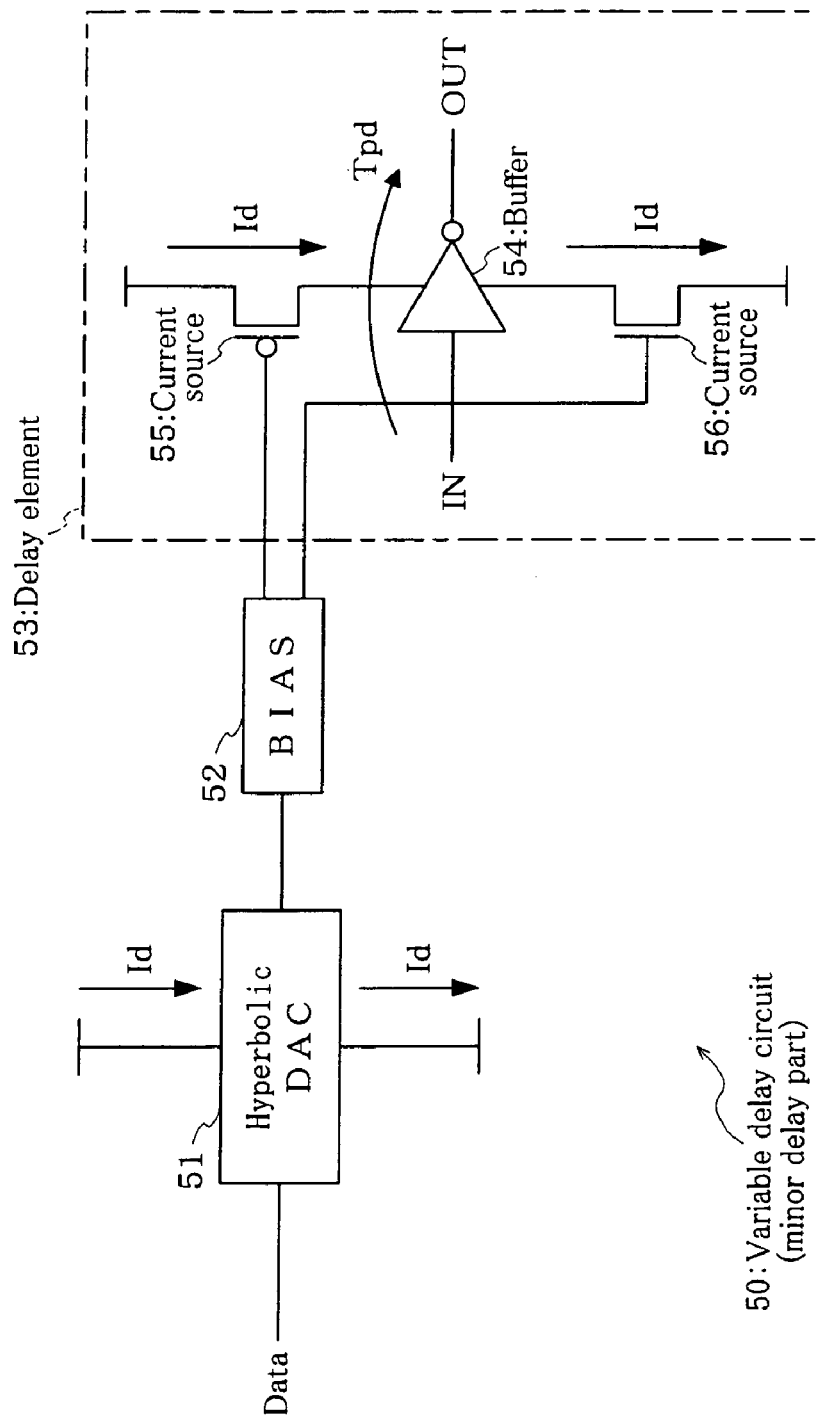
FIG. 2 is a circuit diagram showing a configuration of the variable delay circuit (fine delay part) of the present invention.

FIG. 1 is a block diagram showing a configuration of the semiconductor testing apparatus of this embodiment, and FIG. 2 is a circuit diagram showing a configuration of the variable delay circuit provided in the timing generator.

As shown in FIG. 1, the semiconductor testing apparatus 1 is provided with a pattern generator 10, a waveform formatter 20, a timing generator 30 and a judging part 40.

The pattern generator 10 generates a test pattern for testing an electronic device (DUT) 2, and supplies (outputs) the generated test pattern to the waveform formatter 20.

The waveform formatter 20 formats the received test pattern into a test signal, and supplies the formatted test signal to an electronic device 2 (a device to be tested) according to the timing of a timing signal provided by the timing generator 30.

The timing generator 30 is, for example, a delay circuit, which delays a given reference clock by a desired delay amount, and supplies the delayed reference clock to the waveform formatter 20 as a timing signal. As a result, the timing generator 30 controls timing at which the waveform formatter 20 supplies a test signal.

The judging part 40 judges whether the prescribed properties of the electronic device 2 are good or not by comparing an output signal which is outputted by the electronic device 2 according to a test signal and an expected value signal provided by the pattern generator 10.

The timing generator 30 has a counter 31, a timing memory 32, an exclusive OR circuit 33, an AND circuit 34, a linearizing memory 35 and a variable delay circuit 50.

Figure 6:
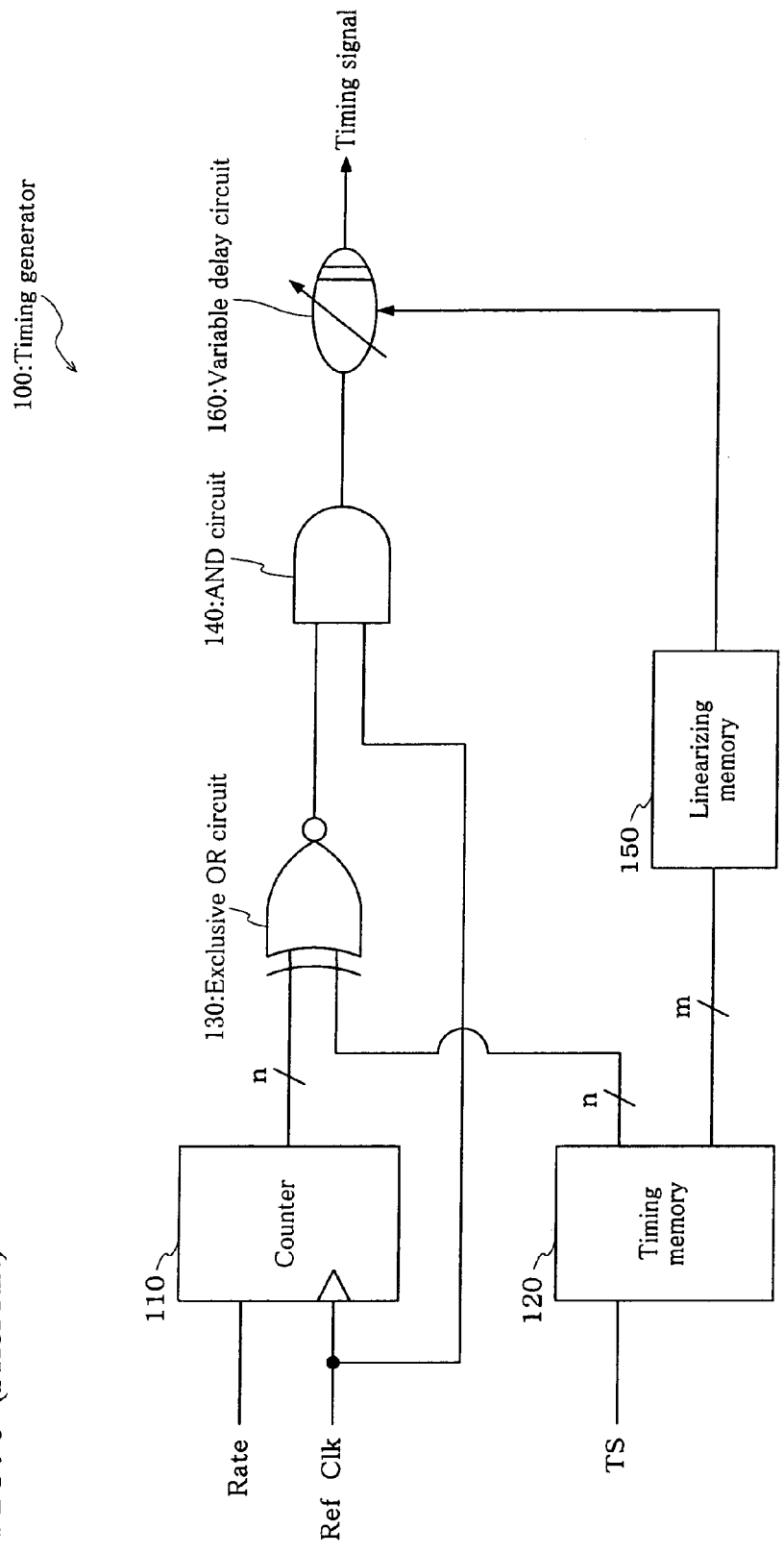
FIG. 6 is a circuit diagram showing a configuration of a conventional timing generator.

As for the counter 31, the timing memory 32, the exclusive OR circuit 33, the AND circuit 34 and the linearizing memory 35, an explanation of each componet is omitted here, since they have the functions similar to those of the counter 110, the timing memory 120, the exclusive OR circuit 130, the AND circuit 140 and the linearizing memory 150, respectively in the conventional timing generator 100 shown and described above with reference to FIG. 6.

As shown in FIG. 2, the variable delay circuit 50 has a DAC (Hyperbolic DC converter) 51, a BIAS 52 and a delay element 53. The delay element 53 has a buffer 54 and current sources 55 and 56.

Figure 7:
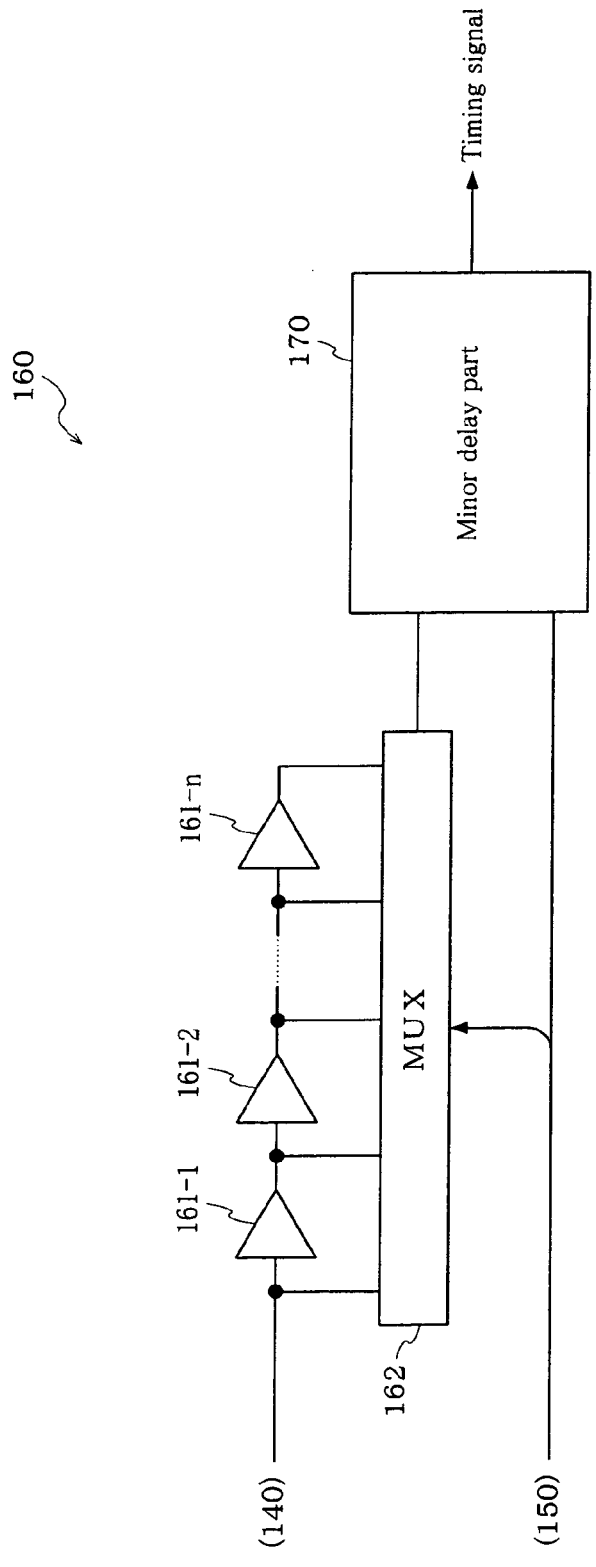
FIG. 7 is a circuit diagram showing a configuration of a conventional variable delay circuit.
Figure 8:
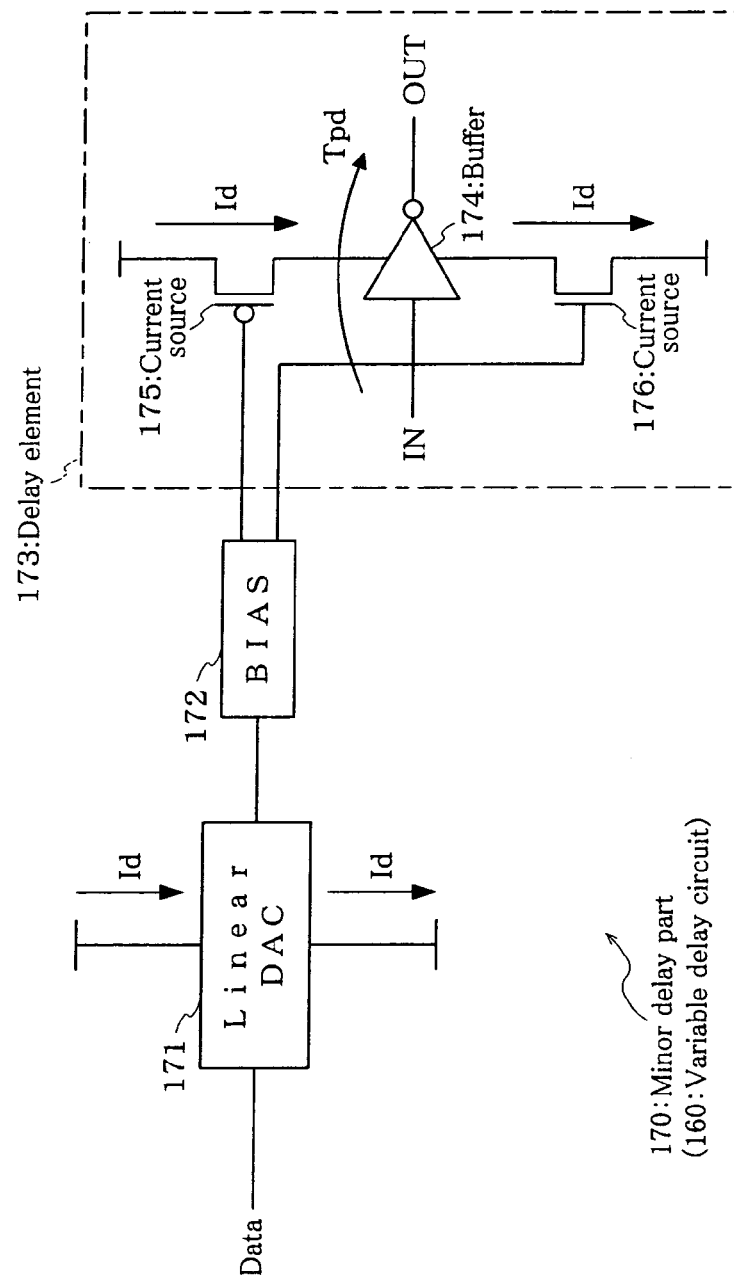
FIG. 8 is a circuit diagram showing a configuration of a conventional fine delay part.
Figure 9:
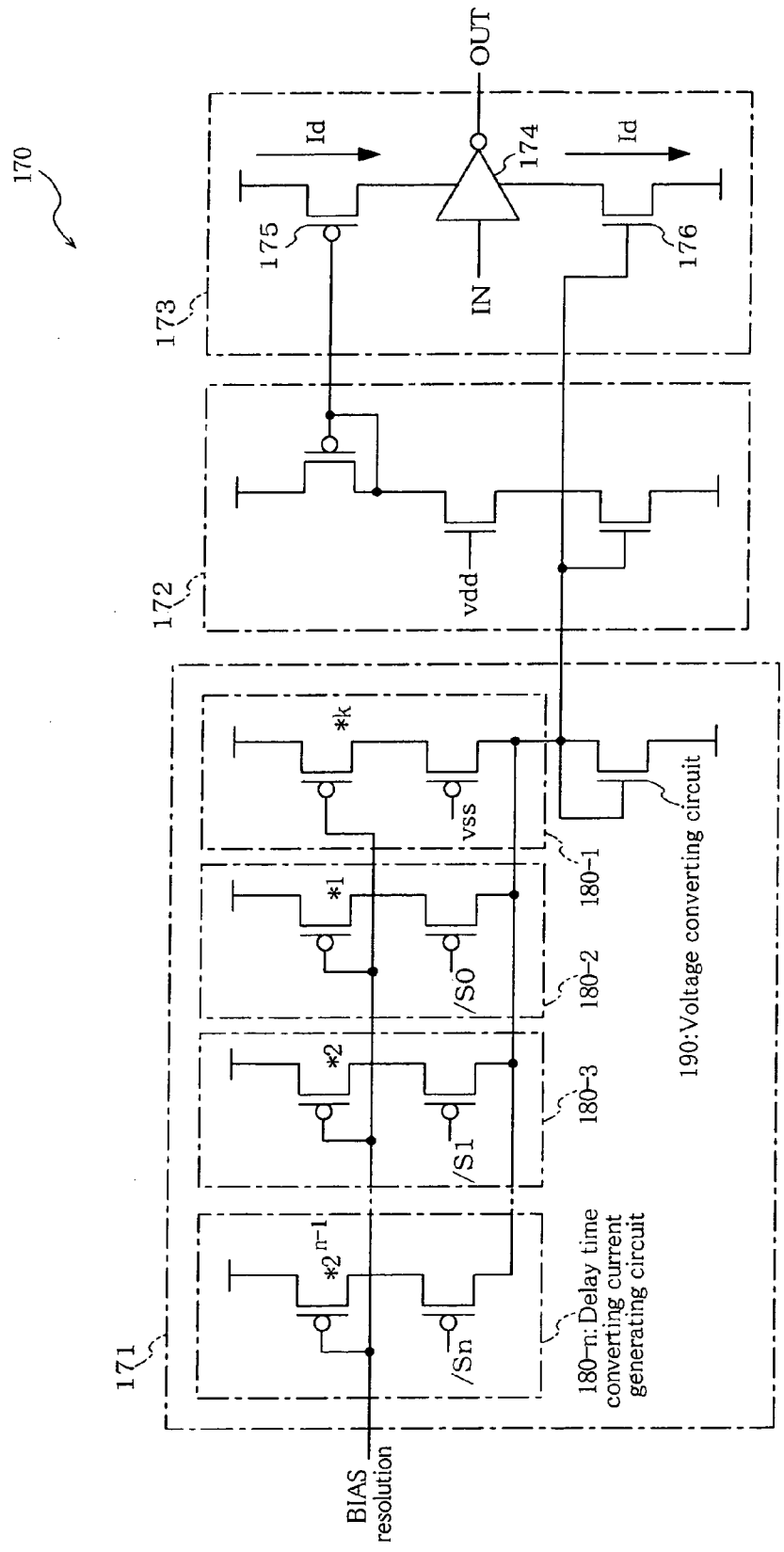
FIG. 9 is a circuit diagram showing a detailed configuration of a conventional fine delay part.

The variable delay circuit 50 further has a buffer 57 (not shown) and a multiplexer 58 (not shown). Since the buffer 57 and the multiplexer 58 (not shown) have functions similar to those of the buffers 161-1 to 161-$n$ or a multiplexer 162 shown in FIG. 7, an explanation of them is omitted here.

Figure 3:
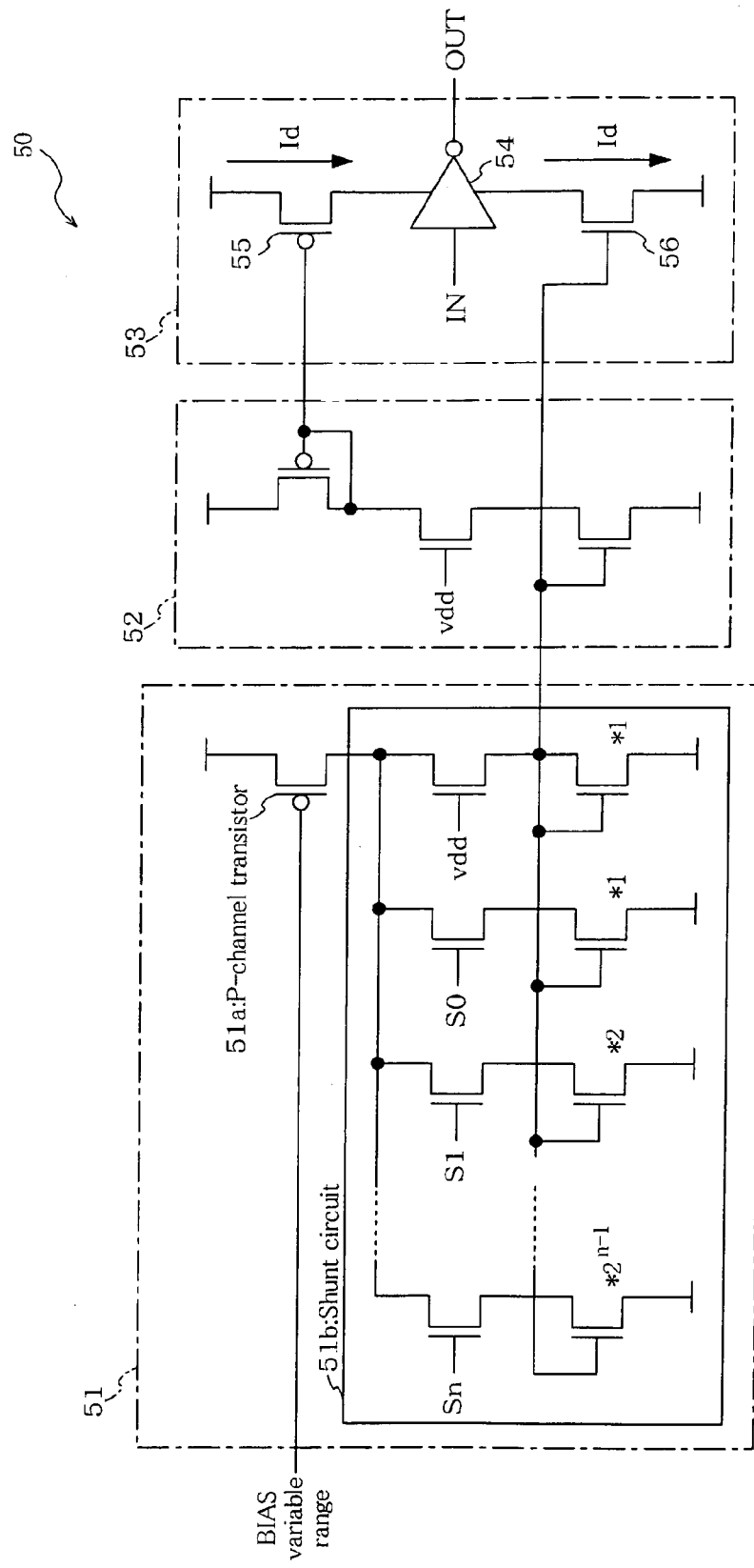
FIG. 3 is a circuit diagram showing a detailed circuit configuration of the variable delay circuit (fine delay part) of the present invention.

As shown in FIG. 3, the DAC 51 has a P-channel transistor 51$a$ and a shunt circuit 51$b$.

A bias voltage corresponding to a variable delay range of the delay element 53 is applied to the gate of the P-channel transistor 51$a$.

The shunt circuit 51$b$ comprises a plurality of parallel circuits commonly connected to an output of P-channel transistor where each parallel circuit is formed of a switch S and a current source being connected in series For each pair, the current sources are connected in a quantity indicated by a binary-coded number (for example, *1, *2, . . . *2$^{n-1}$). Each N-channel transistor is current-mirror connected with the basic N-channel transistor.

Due to the opening and closing of the switch S (S0 to Sn) in each pair, current, which is 1 to ($\frac{1}{2}$$^n$) times the basic current flown by the P-type transistor, is flown to each N-channel transistor.

Due to the current-mirror connection, current flown in a single N-channel transistor, i.e., current Id which is in a hyperbolic relationship (inversely proportional) with the delay setting data DATA, can be mirrored to the delay element 53.

Figure 4:
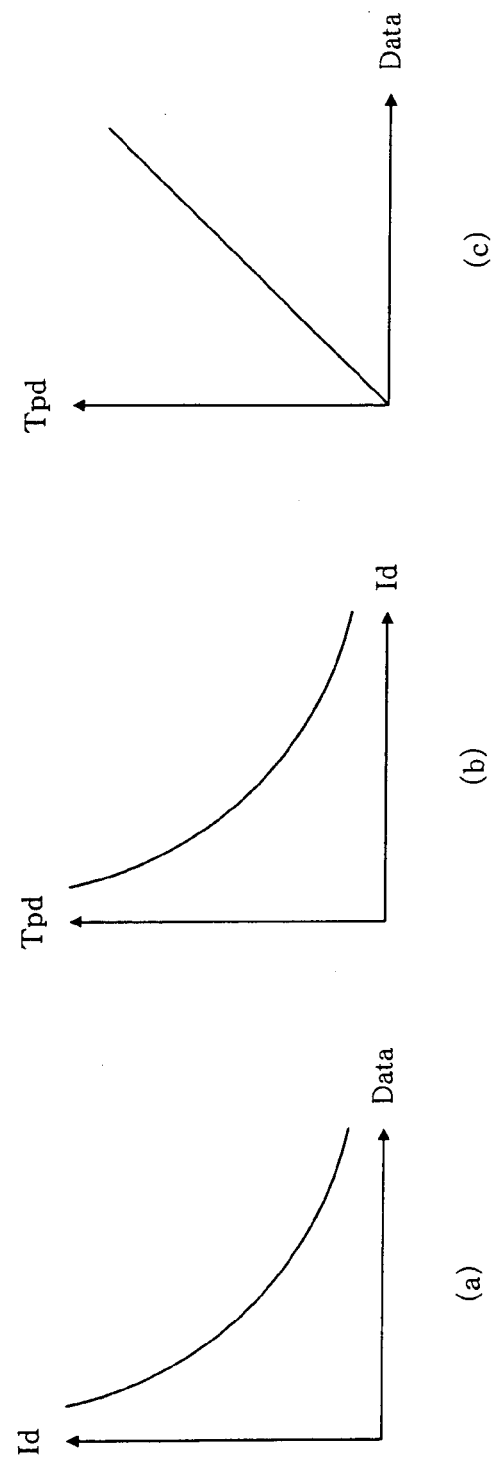
FIG. 4 is a waveform chart showing the relationship between signals in the variable delay circuit (fine delay part), in which (a) shows the relationship between the delay setting data DATA and the current (Id); (b) shows the relationship between the electric current (Id) and the delay time (Tpd); and (c) shows the relationship between the delay setting data DATA and the delay time Tpd.
Figure 10:
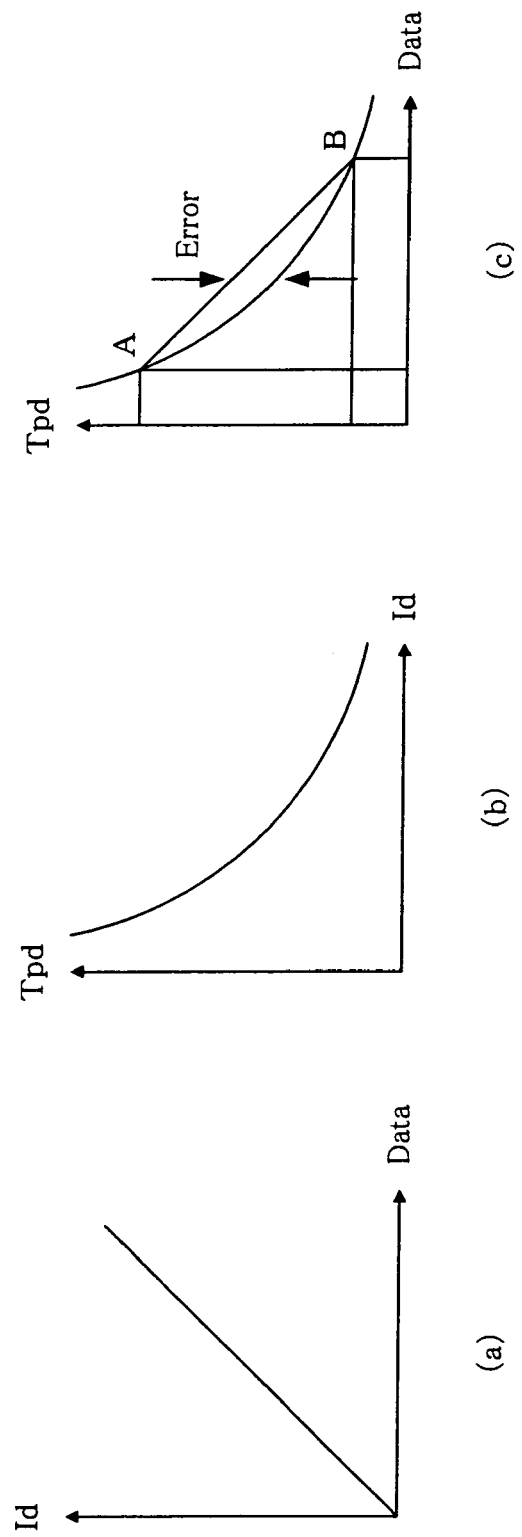
FIG. 10 is a waveform chart showing the relationship between signals or the like in the conventional fine delay part; in which (a) shows the relationship between the delay setting data DATA and the current Id; (b) shows the relationship between the current Id and the delay time Tpd; and (c) shows the relationship between the delay setting data (DATA) and the delay time (Tpd).

The difference between the variable delay circuit 50 and the conventional delay circuit 170 is that the Data-electric current characteristics of the DAC are hyperbolic (FIG. 4($a$), FIG. 10($a$)). Since the relationship between the electric current-propagation delay time is hyperbolic (FIG. 4($b$)), the Data-propagation delay time characteristics become linear according to the present invention (FIG. 4($c$)).

The relationship between the delay setting data DATA and the current Id in the conventional DAC 171 (formula 1), the relationship between the delay setting data DATA and the delay time Tpd in the conventional delay element 173 (formula 2), the relationship between the delay setting data DATA and the current Id in the DAC 51 of the present invention (formula 3), and the relationship between the delay setting data DATA and the delay time Tpd in the delay element 53 of the present invention (formula 4) are respectively expressed by the following formulas.

(Conventional)

$$\text{DAC Id} = a \times \text{Data} \quad \text{(formula 1)}$$

$$\text{Delay element Tpd} = b/\text{Id} = (b/a) \times (1/\text{Data}) \quad \text{(formula 2)}$$

(Present Invention)

$$\text{DAC Id} = c/\text{Data} \quad \text{(formula 3)}$$

$$\text{Delay element Tpd} = b/\text{Id} = (b/c) \times (\text{Data}) \quad \text{(formula 4)}$$

Next, the operation of the variable delay circuit of the present invention will be explained with reference to FIG. 2.

In the DAC 51 of the variable delay circuit 50, current corresponding to the delay setting data from the linearizing memory 150 is flown.

The BIAS 52 allows the DAC 51 to be mirror-connected with the delay element 53. As a result, current Id which is the integral multiple (one in FIG. 2) of the current Id flown in the DAC 51 is flown to the delay element 53.

Then, in the delay element 53, the delay amount Tpd based on the value of the current Id is imparted to a timing signal, and the timing signal is then outputted.

Here, as shown in FIG. 4(*a*), the relationship between the delay setting data DATA and the current Id in the DAC 51 is hyperbolic (inversely proportional). The relationship between the current Id and the delay amount Tpd is hyperbolic (inversely proportional), as shown in FIG. 4(*b*). Therefore, the relationship between the delay setting data DATA and the delay amount Tpd becomes linear, as shown in FIG. 4(*c*), because the two hyperbolic relationships noted above are compensated with one another by the mirror-connection between the DAC 51 and the delay element 53.

As mentioned above, since the delay setting data DATA and the delay amount Tpd has a linear relationship, the delay amount obtained by a single stage of the delay element can be increased.

Figure 5:
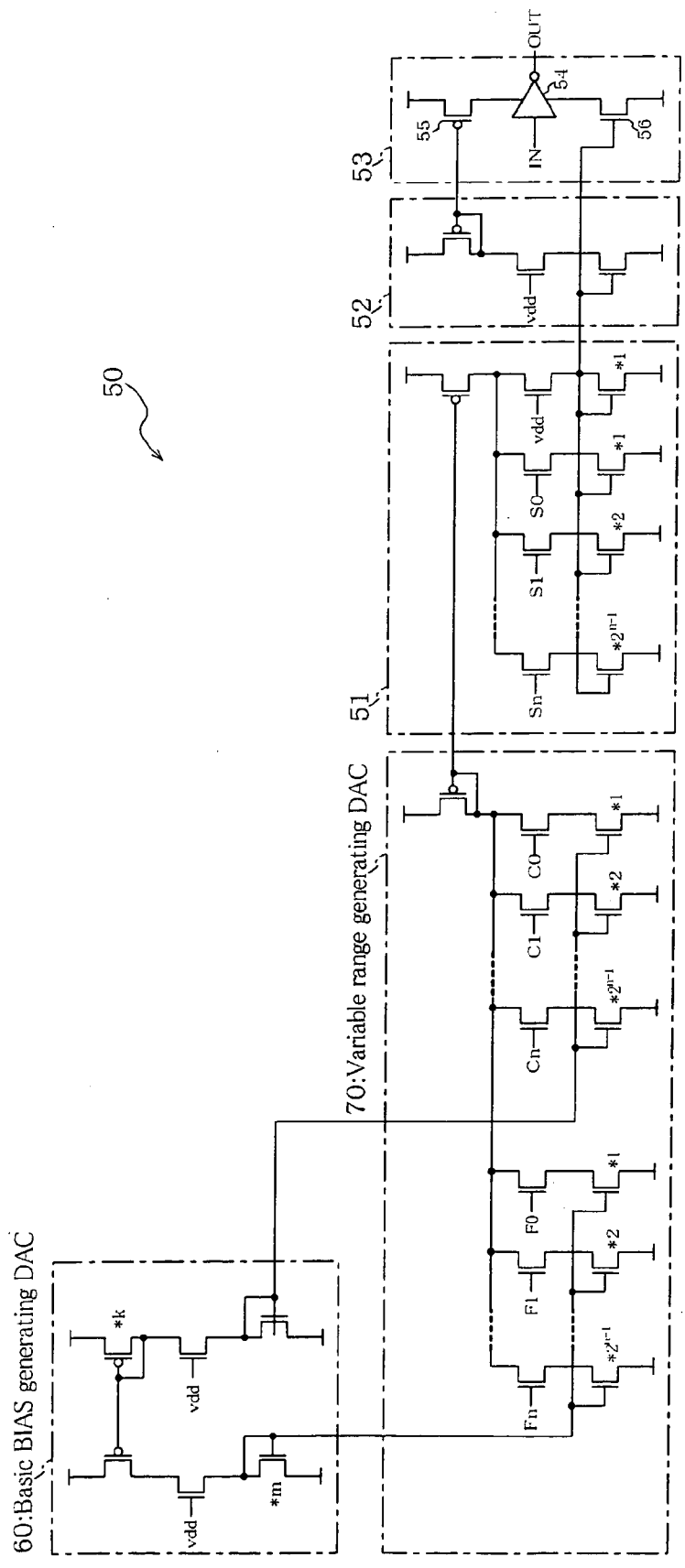
FIG. 5 is a circuit diagram showing another detailed configuration of the variable delay circuit (fine delay part) of the present invention.

As shown in FIG. 5, the BIAS voltage (bias voltage) corresponding to the variable range is generated by using a basic BIAS generating DAC (bias voltage generating DA converter) 60, as shown in FIG. 5. The BIAS voltage is applied to the P-channel transistor of the DAC 51 of the variable delay circuit 50 through a variable range generating DAC 70.

As mentioned hereinabove, according to the variable delay circuit, the timing generator and the semiconductor testing apparatus of this embodiment, due to the provision of the DAC which establishes the hyperbolic relationship between the delay setting data and the current (inversely proportional), the relationship between the delay setting data and the delay amount can be linearized. As a result, the delay amount obtained by one stage of the delay element can be increased. Therefore, an increase in the circuit scale can be suppressed, and power consumption can be reduced.

The preferred embodiment of the variable delay circuit, the timing generator and the semiconductor testing apparatus of the present invention is explained hereinabove. However, the variable delay circuit, the timing generator and the semiconductor testing apparatus of the present invention are not limited to the particular embodiments mentioned above. It is needless to say that various modifications are possible within the scope of the present invention.

For example, in the above-mentioned embodiment, an explanation was made on the variable delay circuit provided in the timing generator. The variable delay circuit is not necessarily provided in the timing generator, and can be provided in an apparatus or a device which already has a variable delay circuit (for example, a digital DLL (digital delay locked loop circuit) or PLL (phase locked loop circuit).

INDUSTRIAL APPLICABILITY

The present invention can be applied to a delay circuit which imparts a prescribed delay to a signal and outputs the signal.

The invention claimed is:

1. A variable delay circuit for producing a desired delay time, comprising:
   a DA converter which supplies a prescribed amount of current based on delay setting data;
   a delay element which imparts to a prescribed signal a delay amount based on the amount of current; and
   a bias circuit which is connected between the DA converter and the delay element such that the amount of current flowing in the delay element and the amount of current flowing in the DA converter become equal,
   wherein the DA converter supplies current which has a hyperbolic relationship with the delay setting data;
   wherein the DA converter includes a transistor to which a bias voltage corresponding to a variable range of the delay element is applied at its input and a shunt circuit connected to an output of the transistor to divide current flown from the transistor in response to the delay setting data, and
   wherein the shunt circuit is comprised of a plurality of parallel circuits commonly connected to the output of the transistor, where each parallel circuit consists of a switch and a current source where the delay setting data is supplied to the corresponding switch.

2. The variable delay circuit according to claim 1, wherein for each stage of the parallel circuit, the current source is configured by N-channel transistors in a quantity which increases in a binary manner.

3. The variable delay circuit according to claim 1 or claim 2, which further comprises a bias voltage generating DA converter for generating a bias voltage.

4. A timing generator for generating a timing signal, comprising:
   a counter which counts and outputs the pulse number of a reference clock;
   a timing memory which receives a timing set signal indicating an output timing of a timing signal and outputs a control signal corresponding to the higher-order bit of the timing set signal and a control signal corresponding to the lower-order bit of the timing set signal;
   an exclusive OR circuit which outputs an H-logic signal when a counted value provided by the counter is in coincidence with the control signal corresponding to the higher-bit of a timing signal provided by the timing memory;
   an AND circuit which outputs a logical product of the signal provided by the exclusive OR circuit and the reference clock;
   a linearizing memory which outputs delay setting data based on the lower-bit control signal from the timing memory; and
   a variable delay circuit which delays a signal outputted by the AND circuit based on the delay setting data and outputs the delayed signal as a timing signal, wherein the variable delay circuit is comprised of:
a DA converter which supplies a prescribed amount of current based on the delay setting data;
a delay element which imparts to a prescribed signal a delay amount based on the amount of current; and
a bias circuit which is connected between the DA converter and the delay element such that the amount of current flowing in the delay element and the amount of current flowing in the DA converter become equal,
wherein the DA converter supplies current which has a hyperbolic relationship with the delay setting data;
wherein the DA converter includes a transistor to which a bias voltage corresponding to a variable range of the delay element is applied at its input and a shunt circuit connected to an output of the transistor to divide current flown from the transistor in response to the delay setting data, and
wherein the shunt circuit is comprised of a plurality of parallel circuits commonly connected to the output of the transistor, where each parallel circuit consists of a switch and a current source where the delay setting data is supplied to the corresponding switch.

5. A semiconductor testing apparatus for testing a semiconductor device, comprising:
a pattern generator which outputs a test pattern signal;
a timing generator which outputs a timing signal;
a waveform formatter which formats the test pattern signal and sends the formatted test pattern signal to a device to be tested according to the timing of the timing signal; and
a judging part which judges the properties of the device based on the output signal which is outputted by the device to be tested according to the testing signal and the test pattern signal from the pattern generator,
wherein the timing generator is comprised of:
a counter which counts and outputs the pulse number of a reference clock;
a timing memory which receives a timing set signal indicating an output timing of a timing signal and outputs a control signal corresponding to the higher-order bit of the timing set signal and a control signal corresponding to the lower-order bit of the timing set signal;
an exclusive OR circuit which outputs an H-logic signal when a counted value provided by the counter is in coincidence with the control signal corresponding to the higher-bit of a timing signal provided by the timing memory;
an AND circuit which outputs a logical product of the signal provided by the exclusive OR circuit and the reference clock;
a linearizing memory which outputs delay setting data based on the lower-bit control signal from the timing memory; and
a variable delay circuit which delays a signal outputted by the AND circuit based on the delay setting data and outputs the delayed signal as a timing signal,
wherein the variable delay circuit is comprised of:
a DA converter which supplies a prescribed amount of current based on the delay setting data;
a delay element which imparts to a prescribed signal a delay amount based on the amount of current; and
a bias circuit which is connected between the DA converter and the delay element such that the amount of current flowing in the delay element and the amount of current flowing in the DA converter become equal,
wherein the DA converter supplies current which has a hyperbolic relationship with the delay setting data;
wherein the DA converter includes a transistor to which a bias voltage corresponding to a variable range of the delay element is applied at its input and a shunt circuit connected to an output of the transistor to divide current flown from the transistor in response to the delay setting data, and
wherein the shunt circuit is comprised of a plurality of parallel circuits commonly connected to the output of the transistor, where each parallel circuit consists of a switch and a current source where the delay setting data is supplied to the corresponding switch.

* * * * *